United States Patent [19]

Derouiche

[11] Patent Number: 5,754,405
[45] Date of Patent: *May 19, 1998

[54] STACKED DUAL IN-LINE PACKAGE ASSEMBLY

[75] Inventor: Nour Eddine Derouiche, Raleigh, N.C.

[73] Assignee: Mitsubishi Semiconductor America, Inc., Durham, N.C.

[*] Notice: The term of this patent shall not extend beyond the expiration date of Pat. No. 5,623,395.

[21] Appl. No.: 559,872

[22] Filed: Nov. 20, 1995

[51] Int. Cl.[6] .................. H05K 7/06; H01L 23/544; H01L 23/58; H01R 9/09
[52] U.S. Cl. .................. 361/744; 257/686; 257/692; 257/696; 257/777; 257/797; 361/735; 361/732; 361/790; 361/803; 439/69
[58] Field of Search .................. 174/52.4, 260; 257/685, 686, 692, 696, 700, 723, 724, 730, 777, 787, 797; 264/272.11; 361/760, 744, 735, 732, 747, 779, 783, 790, 803; 403/361; 438/107, 109; 439/68, 69, 83

[56] References Cited

U.S. PATENT DOCUMENTS

| | | |
|---|---|---|
| 3,515,949 | 6/1970 | Michaels et al. ............ 257/686 |
| 3,671,812 | 6/1972 | Peluso et al. . |
| 4,718,858 | 1/1988 | Godfrey et al. . |
| 4,734,825 | 3/1988 | Peterson . |
| 4,922,381 | 5/1990 | Longerich et al. . |
| 5,025,307 | 6/1991 | Ueda et al. ............ 361/744 |
| 5,105,261 | 4/1992 | Ueda et al. ............ 257/695 |
| 5,121,299 | 6/1992 | Frankeny et al. . |
| 5,198,888 | 3/1993 | Sugano et al. . |
| 5,279,029 | 1/1994 | Burns . |
| 5,315,239 | 5/1994 | Vitriol . |
| 5,329,418 | 7/1994 | Tanabe . |
| 5,329,423 | 7/1994 | Scholz . |
| 5,334,875 | 8/1994 | Sugano et al. . |
| 5,343,075 | 8/1994 | Nishino . |
| 5,446,313 | 8/1995 | Masuda et al. ............ 257/686 |
| 5,457,071 | 10/1995 | Dombroski ............ 437/209 |
| 5,514,907 | 5/1996 | Moshayedi ............ 361/760 |
| 5,543,660 | 8/1996 | Dombroski ............ 257/686 |
| 5,616,962 | 4/1997 | Ishukawa et al. ............ 257/777 |
| 5,623,395 | 4/1997 | Derouiche et al. ............ 361/820 |
| 5,625,221 | 4/1997 | Kim et al. ............ 257/686 |

FOREIGN PATENT DOCUMENTS

| | | | |
|---|---|---|---|
| 60-263448 | 12/1985 | Japan ............ | 257/696 |
| 2-260448 | 10/1990 | Japan ............ | 257/686 |
| 3-32050 | 2/1991 | Japan ............ | 257/777 |
| 3-96266 | 4/1991 | Japan ............ | 257/686 |
| 4-209562 | 7/1992 | Japan ............ | 257/777 |

OTHER PUBLICATIONS

IBM Technical Disclosure Bulletin "Stackable Plastic Semiconductor Chip Carrier" by Robock vol. 27 No. 4B pp. 2389 and 2390, Sep. 1984.

*Primary Examiner*—Donald Sparks
*Attorney, Agent, or Firm*—Lowe, Price, LeBlanc & Becker

[57] ABSTRACT

Each flat package is provided with locking elements of snap fasteners that allow several packages to be assembled into a stack so as to align the leads of each package with respect to the leads of other packages. The leads projecting from both edges of the stack package assembly are inserted into a pair of PC boards having holes arranged so as to accommodate the leads of the assembly. The leads of the PC boards are inserted into a motherboard that carries the external conductors to be connected with the inner circuits of the package assembly.

8 Claims, 5 Drawing Sheets

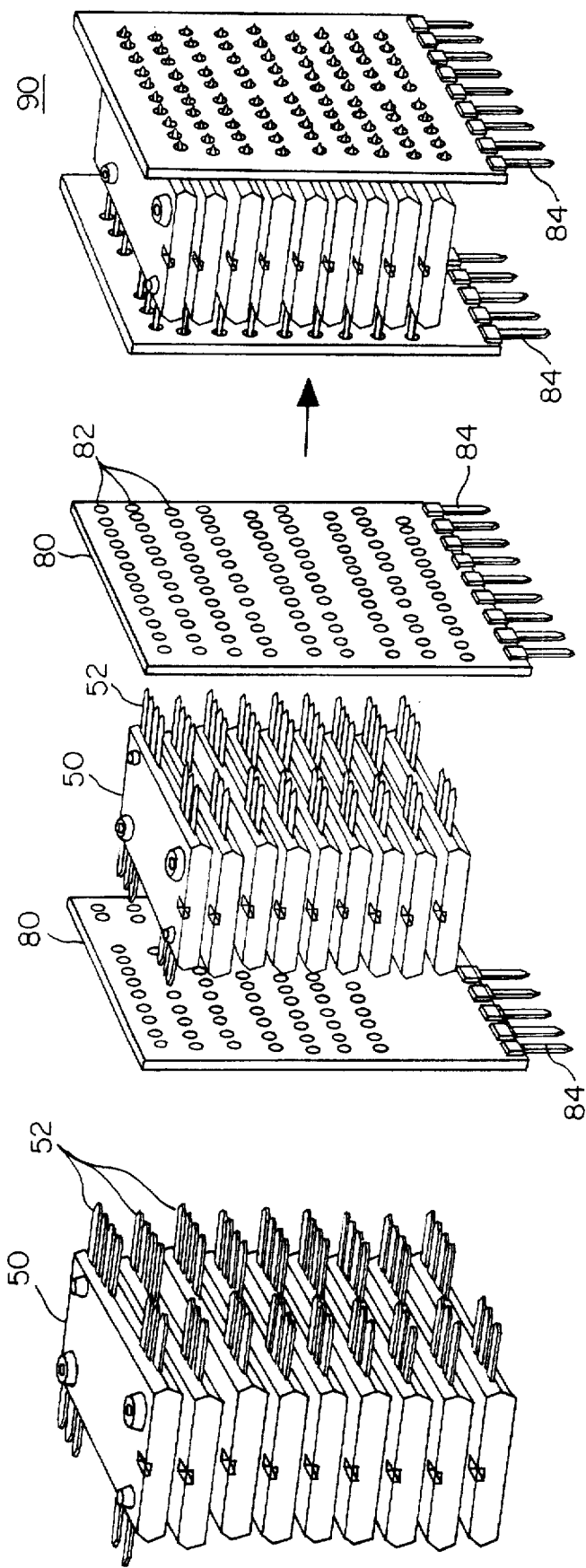

5,754,405

STACKED DUAL IN-LINE PACKAGE ASSEMBLY

TECHNICAL FIELD

The present invention relates generally to integrated circuit packaging, and more particularly, to integrated circuit packages attached to each other to produce a dual-in-line package assembly.

BACKGROUND ART

In an electronic system, components must be mounted on some interconnection network for communication to other parts of the system. The components of various types and configurations can be attached to a printed circuit board (PCB) to make the board a functional electronic device. To reduce costs of the assembly, semiautomatic or automatic insertion of components into PCBs are employed. However, multi-leaded components, e.g. integrated circuits, present problems for semiautomatic or automatic assembly because of lack of uniformity of body size and shape, difficulty of maintaining desired lead conditions, and feed problems at the input to insertion mechanisms. Successful mechanized assembly for integrated circuits is being achieved by using relatively standard integrated circuit (IC) packages. For example, FIG. 1 shows a straight lead flat package that has two rows of vertical leads connectable with a PCB. The flat package has a body that contains integrated circuit elements, and multiple leads arranged on both edges of the body. Flat packages are available with up to 50 leads.

Suitable packages for an integrated circuit must satisfy a series of requirements. They must be strong enough mechanically to withstand the stresses occurring during use and provide easily established and reliable electrical connection from the circuit inside to the outer world.

To provide an IC package assembly, for example, a memory module of very high capacity, a group of IC packages are usually assembled on a PCB carrier connected with a system PCB or a mother board that carries the circuits to be connected with the inner circuits of the IC packages. As illustrated in FIG. 2, such a PCB carrier may have multiple dual-in-line integrated circuit (DIP) packages mounted on a printed board and interconnected with each other by printed conductors on the printed board. However, long interconnection conductors on the printed board create substantial parasitic inductance and capacitance that restrict the operation speed of the PCB-based IC module.

Moreover, the manufacturing of the PCB-based assembly is a very demanding and expensive technological endeavor requiring sophisticated processes and machinery. In particular, the manufacturing sequence may incorporate the steps of solder paste application, solder paste baking out, reflow soldering, solvent cleaning and final inspection.

Further, due to high packaging densities, heat generated within the packages can damage the packaged circuit. Metal heat sinks or other heat transfer means should be bonded to the PC carrier to absorb and disperse heat from operating IC packages. As a result, packaging density is reduced and manufacturing cost is increased.

Therefore, it would be desirable to provide a high-density DIP package assembly that is low in cost and easily implemented.

Also, it would be desirable to arrange the DIP package assembly so as to allow the DIP packages to be interconnected by short printed conductors, in order to reduce the parasitic inductance and capacitance of the assembly, and increase its speed of operation.

DISCLOSURE OF THE INVENTION

Accordingly, one advantage of the present invention is in providing a DIP package assembly with high packaging density.

Another advantage of the present invention is in providing the high-density DIP package assembly that is low in cost and easily implemented.

Still another advantage of the present invention is in arranging the high-density DIP package assembly so as to allow packages to be interconnected by short conductors, in order to reduce the parasitic inductance and capacitance of the package assembly, and increase its speed of operation.

The above and other advantages of the invention are achieved, at least in part, by providing an electronic package assembly comprising a plurality of IC packages having leads arranged along two opposite edges of each of the IC packages. Male and female locking elements mounted on the IC packages constitute snap fasteners to attach IC packages to each other so as to align the leads of each IC package with the leads of other IC packages. The leads are inserted into a pair of printed circuit boards arranged at the opposite edges of the IC packages. Conductors of the printed circuit boards establish a prescribed connection between the leads of the IC packages.

Preferably, each printed circuit board has leads projecting from, at least, one edge of the boards. These leads are inserted into a mother board carrying a set of external connectors to connect the IC packages to the external connectors.

In accordance with the method of the present invention the following steps are carried out. The electronic packages are attached to each other using male and female locking elements mounted on their walls, so as to align leads projecting from two opposite edges of each electronic package with the leads of other electronic packages. The aligned leads are inserted into holes of a pair of printed circuit boards to provide interconnection between the electronic packages. Leads projecting from, at least, one edge of each printed circuit board are inserted into a mother board to provide connection between the electronic packages and external connectors carried by the mother board.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIGS. 7A–7C illustrate producing a DIP package assembly of the present invention.

BEST MODE FOR CARRYING OUT THE INVENTION

Although the invention has general applicability in the field of electronic packaging, the best mode for practicing the invention is based in part on the realization of a structure composed of flat packages which have terminals or leads arranged along two edges of the package. However, it is to be understood that the present invention is also applicable to assemblies that include electronic packages of any type.

Figure 1:
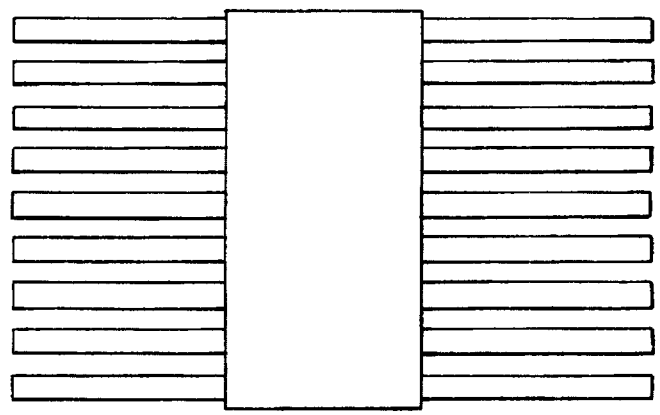
FIG. 1 shows an example of a flat package.
Figure 2:
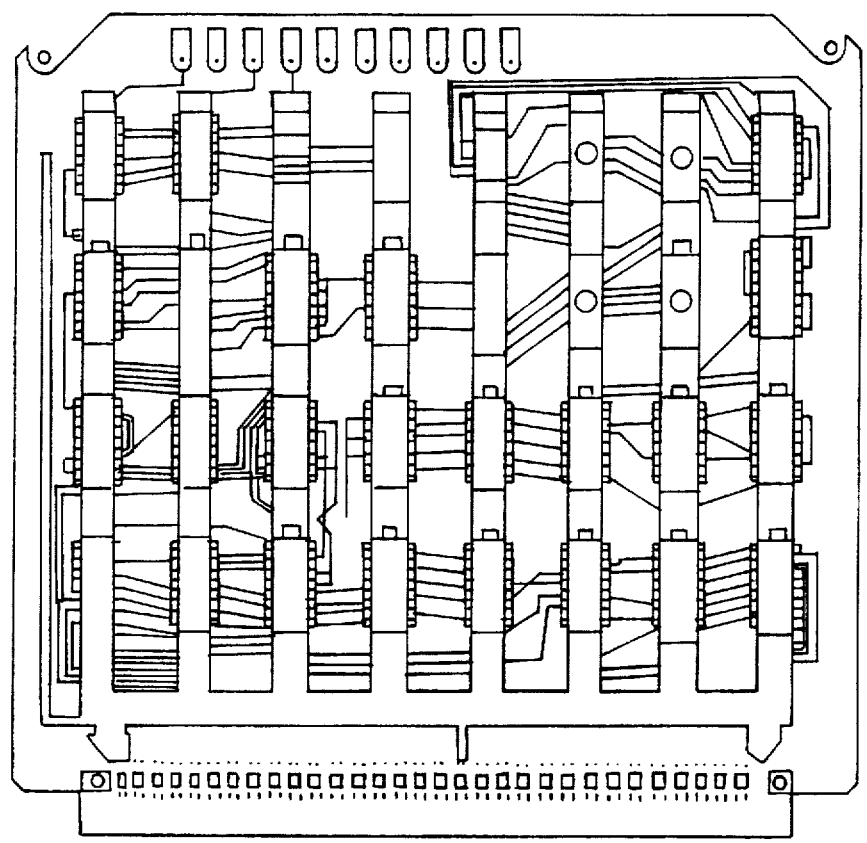
FIG. 2 illustrates a printed circuit board for interconnecting DIP packages.
Figure 3:
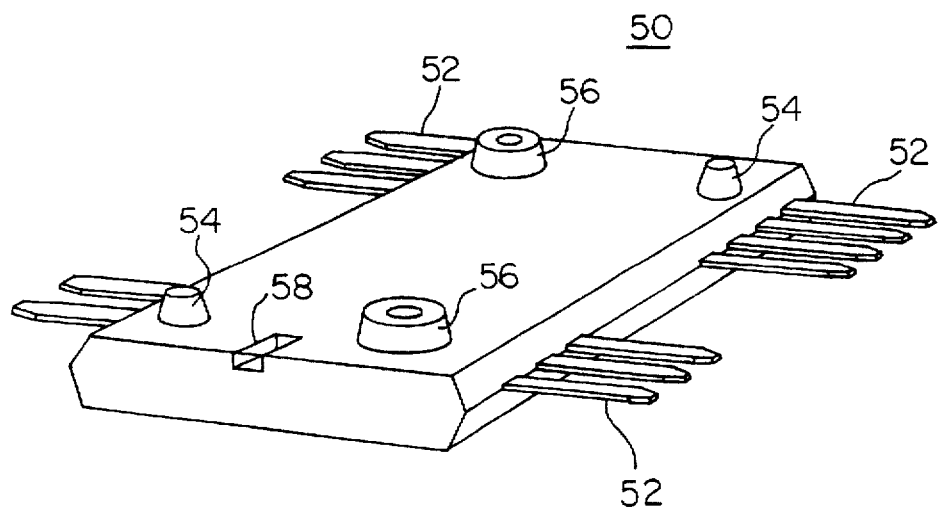
FIG. 3 shows the flat package provided with locking elements in accordance with the present invention.

Reference is now made to FIG. 3 of the drawings showing a flat package 50 having straight leads 52 arranged along both edges of the package. Male and female locking elements 54 and 56, respectively, are fixed on the walls of the package. The package 50 also has a conventional alignment recess 58 used to position packages with respect to a printed circuit board during a placement procedure.

Figure 4A:
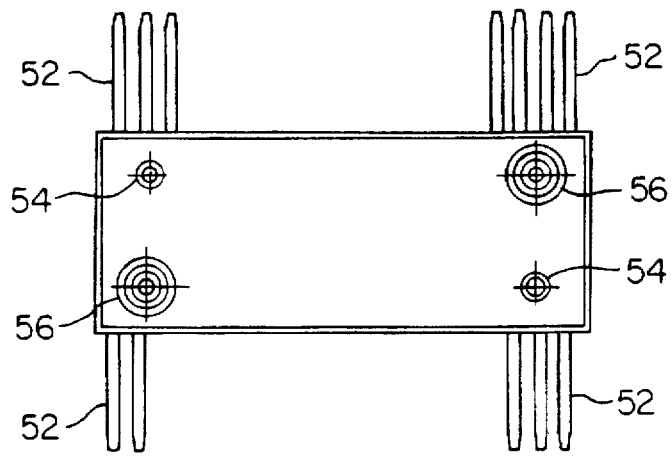
FIGS. 4A, 4B and 4C show front, top and side views, respectively, of the flat package with the locking elements.
Figure 4B:
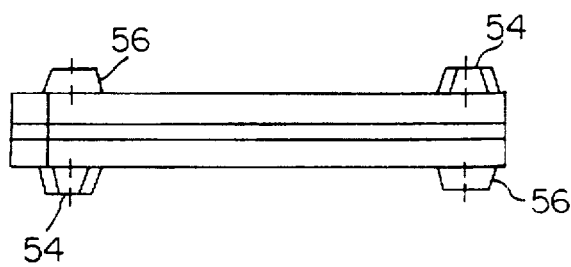
Figure 4C:
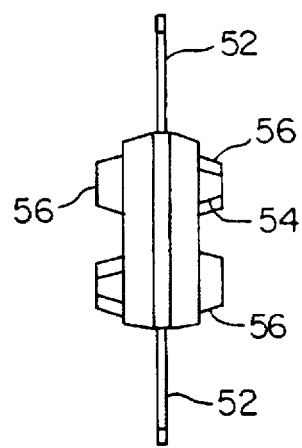

As illustrated in FIGS. 4A, 4B and 4C respectively showing front, top and side views of the package 50, the male and female elements are provided on both walls of the package. For example, the front wall shown in FIG. 4A has the male locking elements 54 on its top left and bottom right portions, and the female locking elements 56 on its top right and bottom left portions. By contrast, the rear wall of the package 50, has the male locking elements 54 on its bottom left and top right portions, and the female locking elements 56 on its bottom right and top left portions.

Figure 5:
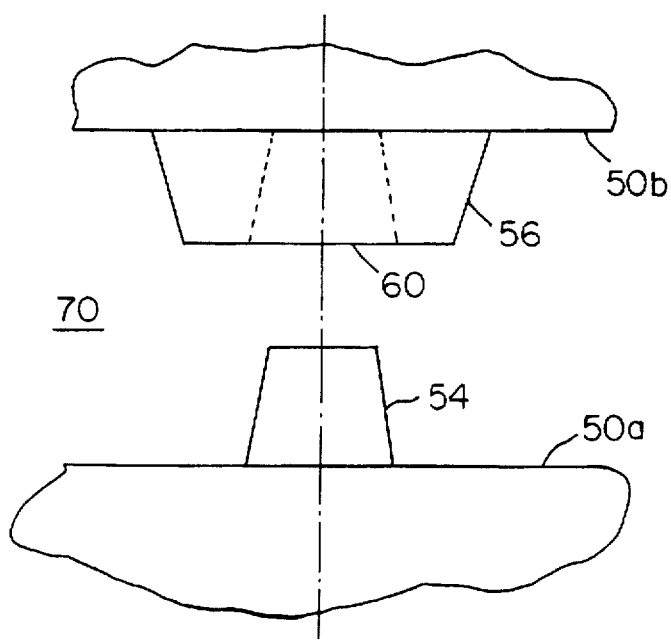
FIG. 5 illustrates a snap fastener for attaching the DIP packages to each other.

As shown in FIG. 5, each of the male locking elements 54 on a flat package 50a can be pressed manually or mechanically into an opening 60 of each of the female locking elements 56 on another package 50b to engage the packages 50a and 50b with each other. Simultaneously, the male locking elements 54 of the package 50b is pressed into the female locking elements 56 of the package 50a. The locking elements 54 and 56 are made of elastic material, e.g. plastic, to provide tight engagement. Hence, each pair of the opposite locking elements on the packages 50a and 50b constitutes a snap fastener 70 for attaching the packages 50a and 50b to each other.

Figure 6:
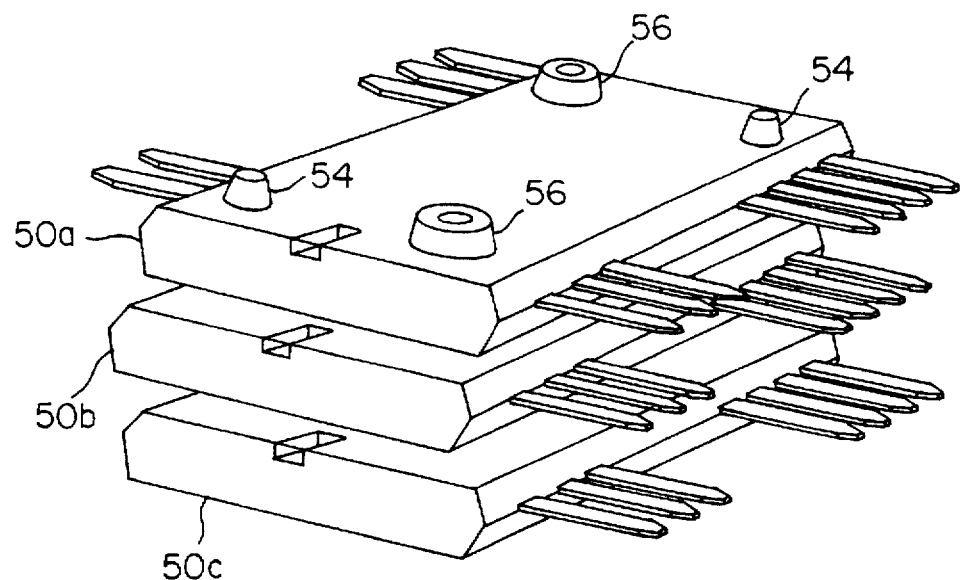
FIG. 6 shows the flat packages attached to each other.

As shown in FIG. 6, the locking elements 54 and 56 on the walls of the packages 50a, 50b, and 50c allow these packages to be attached to each other to create an IC assembly. The packages are oriented with respect to each other using the alignment recesses 58. The size of the locking elements 54 and 56 is selected so as to establish an air gap between the adjacent walls of the packages in the assembly. This air gap allows forced air cooling to be provided. The packages 50a, 50b and 50c are rigidly oriented by the locking elements 54 and 56 so as to align the leads of each package with respect to the leads of other packages.

Referring to FIGS. 7A–7C, the DIP packages 50 may be combined into a DIP package assembly. For example, a high capacity memory module composed of nine memory packages may be assembled. As shown in FIG. 7A, nine packages 50 are assembled into a stack using the snap fasteners 70 on their walls so as to align the leads 52 of each package 50 with respect to the leads 52 of other packages. As shown in FIG. 7B, the leads 52 projecting from both edges of the nine-package stack are inserted into a pair of through-hole printed circuit (PC) boards 80 having holes 82 arranged so as to accommodate the leads 52. Printed conductors are formed on the PC boards 80 to interconnect the holes 82 so as to provide a prescribed connection between the leads 52 of the packages 50 in the IC module. As the leads 52 of each package 50 in the stack are aligned with respect to the leads 52 of other packages, short printed conductors can be used to interconnect the packages. The PC boards 80 may be provided with leads 84 projecting from one edge of each PC board.

As shown in FIG. 7C, the inserted leads 52 are soldered to the PC boards 80 to produce a DIP package assembly 90. The leads 84 of the PC boards 80 may be inserted into a motherboard that carries the external conductors to be connected with the inner circuits of the package assembly 90, and soldered to the motherboard. Although FIGS. 7A–7C illustrate a set composed of nine DIP packages, it is to be understood that any number of the packages 50 can be attached to each other.

In summary, the results and advantages of the DIP package assembly of the present invention can now be more fully appreciated. Each package is provided with locking elements of snap fasteners that allow several packages to be assembled into a stack so as to align the leads of each packet with respect to the leads of the other packages. The leads projecting from both edges of the stack package assembly are inserted into a pair of PC boards having holes arranged so as to accommodate the leads of the assembly. The leads of the PC boards may be inserted into a motherboard that carries the external conductors to be connected with the inner circuits of the package assembly.

Accordingly, the high density DIP package assembly can be provided that is low in cost and can be easily implemented.

It will also be recognized that the DIP package assembly of the present invention has short conductors for interconnecting packages in the assembly. As a result, parasitic inductance and capacitance can be reduced compared to conventional PCB-based DIP package assemblies, and the speed of operation can be increased.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

I claim:

1. An electronic package assembly, comprising:
    a plurality of IC packages having leads arranged along two opposite edges of each of the IC packages,
    male and female locking elements fixed on said IC packages and constituting snap fasteners for attaching said IC packages to each other to combine said IC packages into an IC assembly, and
    a pair of printed circuit boards arranged at the opposite edges of the IC packages and having holes for receiving the leads of said IC packages in the IC assembly, and conductors interconnecting the holes for establishing a prescribed connection between the leads of the IC packages, and
    said male and female locking elements rigidly orienting the IC packages in the IC assembly so as to align the leads of each of the IC packages in the IC assembly with the leads of other IC packages in the IC assembly and with the holes of said printed circuit boards, the size of the locking elements being selected to space the IC packages in the IC assembly with respect to each other for establishing an air gap between the IC packages in the IC assembly.

2. The assembly of claim 1, wherein each of said printed circuit boards has leads projecting from, at least, one edge of the boards, for connecting the IC packages with a mother board carrying a set of external connectors.

3. The assembly of claim 1, wherein a pair of the male locking elements and a pair of female locking elements are fixed on a wall of each of the IC packages for rigidly orienting the IC packages with respect to each other.

4. The assembly of claim 3, wherein the male locking elements are mounted in first and second opposite corners of the wall, and the female locking elements are mounted in third and fourth opposite corners of the wall.

5. The assembly of claim 4, wherein each of the IC packages comprises a flat body with two parallel walls, and said pairs of male and female locking elements are mounted on each wall of the body.

6. A method of assembling electronic packages comprising the steps of:

producing an IC assembly by attaching a predetermined number of the electronic packages to each other using male and female locking elements of snap fasteners mounted on walls of the electronic packages, so as to align leads projecting from two opposite edges of each of the electronic packages with the leads of other electronic packages, inserting aligned leads of the IC assembly into holes of a pair of printed circuit boards to provide interconnection between the electronic packages in the IC assembly, and inserting leads projecting from, at least, one edge of each of the printed circuit boards, into a mother board to provide connection between the electronic packages in the IC assembly and external connectors carried by the mother board.

7. The method of claim 6, wherein the size of the locking elements in the snap fastener being selected to space the electronic packages in the IC assembly with respect to each other for establishing an air gap between the electronic packages in the IC assembly.

8. An electronic package, comprising:

a flat body containing electronic elements and having side walls, plurality of leads arranged along two opposite edges of said body for connecting said electronic elements to a set of external conductors, and a pair of male locking elements and a pair of female locking elements of snap fasteners mounted on, at least, one of said side walls, said body being rigidly oriented by said locking elements with respect to other electronic package so as to align said leads with leads of the other electronic package, the size of said male and female locking elements in the snap fasteners being selected to space the electronic package with respect to the other electronic package for establishing an air gap between the electronic package and the other electronic package.

* * * * *